(12) United States Patent
Cotler et al.

(10) Patent No.: US 9,089,862 B2
(45) Date of Patent: Jul. 28, 2015

(54) PRESSURE BASED LIQUID FEED SYSTEM FOR SUSPENSION PLASMA SPRAY COATINGS

(75) Inventors: Elliot M. Cotler, Brooklyn, NY (US); Ronald Molz, Mt. Kisco, NY (US)

(73) Assignee: OERLIKON METCO (US) INC., Westbury, NY (US)

( * ) Notice: Subject to any disclaimer, the term of this patent is extended or adjusted under 35 U.S.C. 154(b) by 126 days.

(21) Appl. No.: 13/994,442

(22) PCT Filed: Dec. 14, 2011

(86) PCT No.: PCT/US2011/064919
§ 371 (c)(1),
(2), (4) Date: Jun. 14, 2013

(87) PCT Pub. No.: WO2012/082902
PCT Pub. Date: Jun. 21, 2012

(65) Prior Publication Data
US 2013/0270355 A1     Oct. 17, 2013

Related U.S. Application Data

(60) Provisional application No. 61/423,428, filed on Dec. 15, 2010.

(51) Int. Cl.
*B05B 1/24*    (2006.01)
*B05B 15/02*    (2006.01)
(Continued)

(52) U.S. Cl.
CPC . *B05B 15/02* (2013.01); *B05B 7/04* (2013.01); *B05B 7/0815* (2013.01); *B05B 7/203* (2013.01); *B05B 7/205* (2013.01); *B05B 7/226* (2013.01); *B05B 15/00* (2013.01); *B05B 15/025* (2013.01);
(Continued)

(58) Field of Classification Search
CPC ...... B05B 7/0815; B05B 7/205; B05B 7/203; B05B 15/0208; B05B 15/025; B05B 15/00; B05B 7/04; B05B 15/02; B05B 7/226; B05B 15/0258; B05B 15/0266; B05B 15/003; C23C 4/127; C23C 4/105; H05H 1/42; H05H 1/34; H01L 21/67051; B08B 9/00; B05C 11/00
USPC ............... 239/1, 8, 11, 79, 83, 104, 106, 112, 239/289, 418, 419, 419.3; 219/121.36, 219/121.47, 121.48, 121.49, 121.5; 134/94.1, 95.1, 95.3
See application file for complete search history.

(56) References Cited

U.S. PATENT DOCUMENTS 7,644,872 B2 *   1/2010   Lang et al. ..................... 239/106
2003/0172952 A1 *   9/2003   Takase et al. ................ 134/95.1
(Continued)

OTHER PUBLICATIONS

International Search Report and Written Opinion issued in counterpart International Application No. PCT/US2011/064919.

*Primary Examiner* — Steven J Ganey
(74) *Attorney, Agent, or Firm* — Greenblum & Bernstein, P.L.C.

(57) ABSTRACT

Apparatus (1) for injecting a liquid in an area of a thermal spray gun (100). The apparatus (1) includes an injector cleaning device (10) having an inlet connectable (19) to at least one feedstock supply line (18), an inlet connectable (17) to at least one gas supply line (16), and an inlet connectable (21) to at least one liquid medium supply line (20). An injector (30) orifice is coupled to the injector cleaning device (10) and is adapted to at least one of inject a liquid jet into a hot stream created in the area of the thermal spray gun (100) and receive feedstock, gas and liquid passing into the inlets.

27 Claims, 8 Drawing Sheets

(51) Int. Cl.
*B05B 7/08* (2006.01)
*B05B 7/20* (2006.01)
*B05B 15/00* (2006.01)
*B05B 7/04* (2006.01)
*H05H 1/34* (2006.01)
*H01L 21/67* (2006.01)
*C23C 4/10* (2006.01)
*C23C 4/12* (2006.01)
*H05H 1/42* (2006.01)
*B05C 11/00* (2006.01)
*B05B 7/22* (2006.01)
*B08B 9/00* (2006.01)

(52) U.S. Cl.
CPC ......... *B05B 15/0208* (2013.01); *B05B 15/0258* (2013.01); *B05B 15/0266* (2013.01); *B05C 11/00* (2013.01); *C23C 4/105* (2013.01); *C23C 4/127* (2013.01); *H01L 21/67051* (2013.01); *H05H 1/34* (2013.01); *H05H 1/42* (2013.01); *B05B 15/003* (2013.01); *B08B 9/00* (2013.01)

(56) References Cited

U.S. PATENT DOCUMENTS

| | | | |
|---|---|---|---|
| 2004/0226508 A1 | 11/2004 | Ma et al. | |
| 2005/0211279 A1* | 9/2005 | Chin et al. | 134/94.1 |
| 2006/0289405 A1 | 12/2006 | Oberste-Berghaus et al. | |
| 2008/0090071 A1 | 4/2008 | Valle et al. | |

* cited by examiner

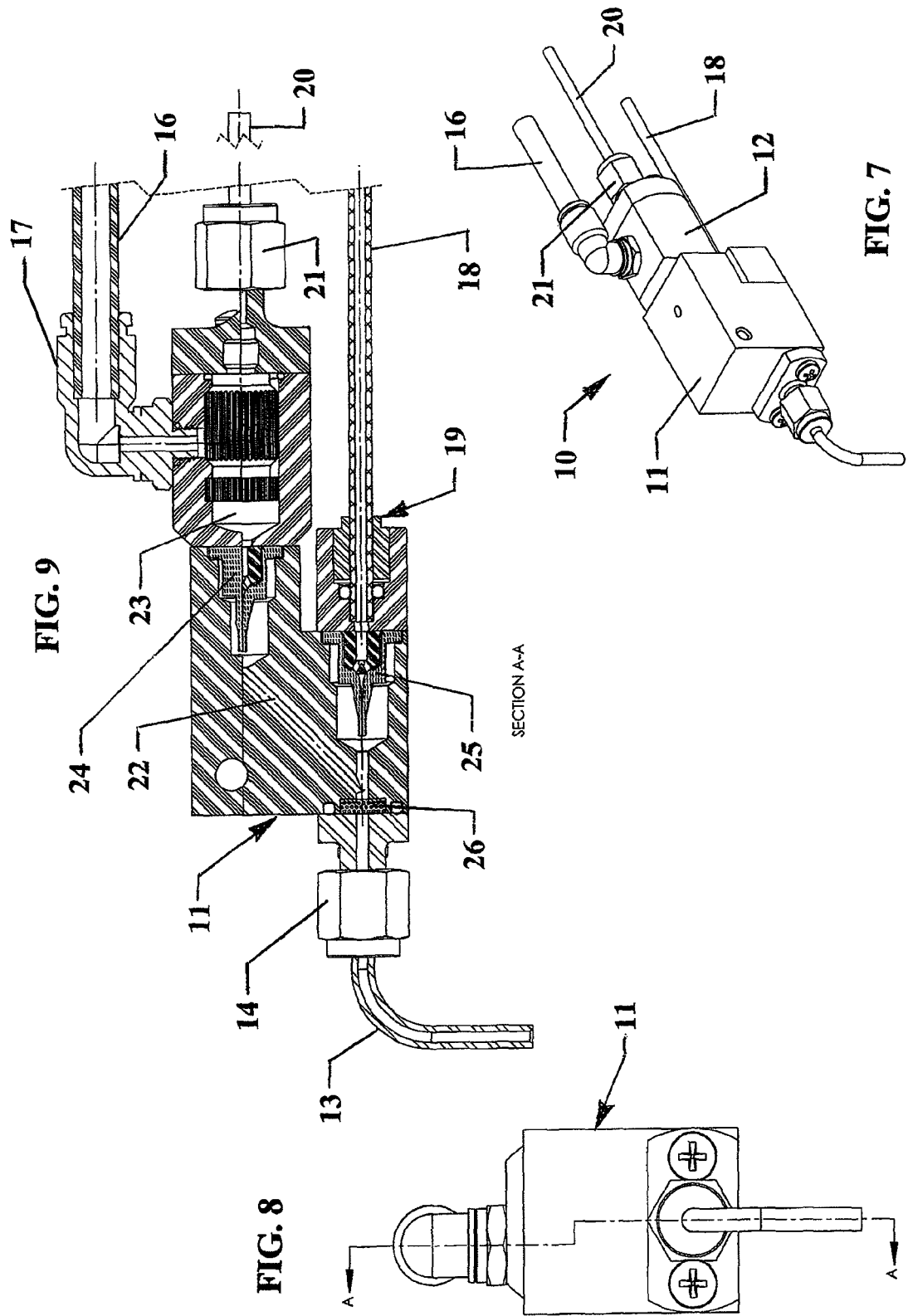

PRESSURE BASED LIQUID FEED SYSTEM FOR SUSPENSION PLASMA SPRAY COATINGS

CROSS-REFERENCE TO RELATED APPLICATIONS

The instant application is a U.S. National Stage Application of International Application No. PCT/US2011/064919, which was filed on Dec. 14, 2011 and was published as WO/2012/082902, and claims the benefit of U.S. provisional application No. 61/423,428, filed Dec. 15, 2010, the disclosures of each of these applications are hereby expressly incorporated by reference hereto in its entirety.

STATEMENT REGARDING FEDERALLY SPONSORED RESEARCH OR DEVELOPMENT

Work resulting in the instant invention was partially supported by funding from the National Institute of Standards and Technology under Advanced Technology Program number 70NANB7H7009.

REFERENCE TO A COMPACT DISK APPENDIX

Not applicable.

BACKGROUND OF THE INVENTION

The thermal spray process has been widely used to deposit coatings for industrial applications, including aerospace, automotive, petroleum and petrochemical, biomedical, etc. See Mateyja D., *Plasma spraying of metallic and ceramic coatings*. 1989, New York: John Wiley & Sons, the disclosure of which is hereby expressly incorporated by reference in its entirety. Thermal spray ceramic coatings are usually made from a powder feedstock. However, individual ultrafine particles (usually <5 μm) cannot be thermally sprayed using conventional powder feeding methods. A high carrier gas flow rate is required for the ultrafine particle penetration within the plasma jet. Such a cold gas flow rate will drastically perturb the plasma jet. See Fauchais, P., et al., *Parameters controlling liquid plasma spraying: Solutions, sols, or suspensions*. Journal of Thermal Spray Technology, 2008 17(1): p. 31-59, the disclosure of which is hereby expressly incorporated by reference in its entirety. On the other hand, these ultrafine particles would clog the hoses and fittings during delivery from the powder feeder to the thermal spray torch. See Lima, R. S. and B. R. Marple, *Thermal spray coatings engineered from nanostructured ceramic agglomerated powders for structural, thermal barrier and biomedical applications: A review*. Journal of Thermal Spray Technology, 2007 16(1): p. 40-63 and Chen, Z., et al., *Air-plasma spraying colloidal solutions of nanosized ceramic powders*. Journal of Materials Science, 2004 39(13): p. 4171-4178, the disclosure of each of these documents is hereby expressly incorporated by reference in its entirety.

Recently, a suspension plasma spray (SPS) process has been developed for the deposition of nanostructured coatings. See Chen, Z., et al., *Air-plasma spraying colloidal solutions of nanosized ceramic powders*. Journal of Materials Science, 2004 39(13): p. 4171-4178, Fauchais, P., et al., *Suspension and solution plasma spraying of finely structured layers: potential application to SOFCs*. Journal of Physics D-Applied Physics, 2007 40(8): p. 2394-2406, Burlacov, I., et al., *Induction plasma-sprayed photocatalytically active titania coatings and their characterisation by micro-Raman spectroscopy*. Surface & Coatings Technology, 2006 201(1-2): p. 255-264, Tomaszek, R., et al., *Microstructural characterization of plasma sprayed TiO2 functional coating with gradient of crystal grain size*. Surface & Coatings Technology, 2006 201(1-2): p. 45-56, Toma, F. L., et al., *Nanostructured photocatalytic titania coatings formed by suspension plasma spraying*. Journal of Thermal Spray Technology, 2006 15(4): p. 587-592, Berghaus, J. O., B. Marple, and C. Moreau, *Suspension plasma spraying of nanostructured WC-12Co coatings*. Journal of Thermal Spray Technology, 2006 15(4): p. 676-681, Fauchais, P., et al., *Understanding of suspension DC plasma spraying of finely structured coatings for SOFC*. Ieee Transactions on Plasma Science, 2005 33(2): p. 920-930, Wittmann-Teneze, K., et al., *Nanostructured zirconia coatings processed by PROSOL deposition*. Surface & Coatings Technology, 2008 202(18): p. 4349-4354, Chen, D. Y., E. H. Jordan, and M. Gell, *Microstructure of Suspension Plasma Spray and Air Plasma Spray Al2O3-ZrO2 Composite Coatings*. Journal of Thermal Spray Technology, 2009 18(3): p. 421-426, and Chen, D. Y., E. H. Jordan, and M. Gell, *Suspension plasma sprayed composite coating using amorphous powder feedstock*. Applied Surface Science, 2009 255(11): p. 5935-5938, the disclosure of each of these documents is hereby expressly incorporated by reference in its entirety. In SPS, the ultrafine or nano sized particles are dispersed in a liquid medium such as water or ethanol to form a suspension and then the suspension is injected into the plasma torch. The suspension droplets will undergo liquid evaporation, particles melting process in the plasma jet and form the coatings upon impacting the substrate. Chen, D. Y., E. H. Jordan, and M. Gell, *Microstructure of Suspension Plasma Spray and Air Plasma Spray Al2O3—ZrO2 Composite Coatings*. Journal of Thermal Spray Technology, 2009 18(3): p. 421-426 and Chen, D. Y., E. H. Jordan, and M. Gell, *Suspension plasma sprayed composite coating using amorphous powder feedstock*. Applied Surface Science, 2009 255(11): p. 5935-5938, used the molecularly mixed amorphous powder as feedstock and prepared phase homogeneously distributed ceramic coatings using the suspension plasma spray process. Waldbillig, D. and O. Kesler, *The effect of solids and dispersant loadings on the suspension viscosities and deposition rates of suspension plasma sprayed YSZ coatings*. Surface & Coatings Technology, 2009 203(15): p. 2098-2101, the disclosure of which is hereby expressly incorporated by reference in its entirety, studied the effect of solids and dispersant loading on the deposition rate of suspension plasma sprayed YSZ coatings. In the reported suspension plasma spraying process, homemade delivery systems with a peristaltic pump were used to deliver the suspension to the plasma jet.

While liquid jet injection into plasma was well observed and studied (see P. Fauchais and G. Montavon, *Latest Developments in Suspension and Liquid Precursor Thermal Spraying*. Thermal Spray 2009: Proceedings of the ITSC, 2009, ASM International: p. 136-149, R. Etchart-Salas, V. Rat, J. F. Coudert and P. Fauchaus, *Parameters controlling properties of coatings sprayed by suspension plasma spraying*. Proceedings of the ITSC, 2008: p. 506-511, C. Marchand, C. Chazelas, G Mariaux and A. Vardelle, *Liquid precursor plasma spraying: observation of liquid feedstock break-up*. Proceedings of the ITSC, 2008: p. 512-516, and R. Vassen, H. Kassner, G. Mauer and D. Stover, *Suspension plasma spraying: Process Development and Applications*. Thermal Spray 2009: Proceedings of the ITSC, 2009, ASM International: p. 162-167, the disclosure of each of these documents is hereby expressly incorporated by reference in its entirety), the propensity of suspensions to clog lines and injector orifice gained notoriety among researches and practitioners alike, and rendered the SPS process as highly unreliable and impractical. Combined with a high cost of sub-micron and nano-sized feedstock, any significant loss of material due to line flush or non-stop running further diminishes ROI and prospects of practical SPS process implementation. To make stable and robust coating deposition, there is a great need for the development of commercially available liquid delivery system for the suspension/solution thermal spraying.

SUMMARY OF THE INVENTION

With the above-noted background research in mind, a prototype of a liquid feedstock feeder that is based on the SULZER METCO 5MPE powder feeder platform was developed. $TiO_2$, $Al_2O_3$, $ZrO_2$ coatings were deposited through this liquid delivery system using a SULZER METCO 9 MB plasma gun. The phase composition and microstructure of the as-sprayed coatings were investigated. A detailed discussion of this can be found in Article entitled "Pressure-Based Liquid Feed System for Suspension Plasma Spray Coatings" by Elliot M. Cotler, Dianying Chen, Ronald J. Molz printed in the Journal of Thermal Spray Technology Volume 20, Number 4, pages 967-973 in May 2011). The disclosure of this document is hereby expressly incorporated by reference in its entirety.

Research found that injector proximity to plasma plume makes it necessary to maintain thermal management at all times. Any clogging upstream of the injector diminishes the flow of suspension through the injector orifice and reduces the cooling effect of a feedstock on internal surfaces. The resulting rise in temperature boils out the liquid phase and leaves a crust of agglomerated solids that could be further sintered into a practically irremovable plug. With that in mind, attempts were made to keep the injector cool and clean by switching to gas purge when feedstock is not fed, especially during plasma gun start-ups and shut-downs. Surprisingly, while gas purging did keep injector clean during gas purge (soon after switch back to suspension feed) within a few seconds the injector orifice was consistently clogged. The autopsies of ruined injectors indicated that gas purge led to creation of dried agglomerated crust of solids on inside surfaces exposed to gas flow. The subsequent flow of feedstock material lifted up crust flakes from the walls and carried them down toward the injector orifice. The size and shape of these flakes promoted quick clogging of the injector. To overcome the problem of after-purge clogging, the newly developed purge system includes a mist purger whereby the injection of a small amount of liquid into a purge gas occurs before its entrance to the feedstock injector. This minute amount of liquid is introduced by a pneumatically driven plunger pump into a mist generating device, where small droplets of liquid were formed and mixed with purge gas. The produced mixture combines the advantages of high purge gas velocity with high cooling capacity of mist and with wetting and washing properties of liquid.

In accordance with one non-limiting aspect of the invention there is provided an apparatus for injecting a liquid in an area of a thermal or thermo (e.g., plasma or HVOF) spray gun. The apparatus comprises an injector cleaning device having an inlet connectable to at least one feedstock supply line, an inlet connectable to at least one gas supply line, and an inlet connectable to at least one liquid medium supply line. An injector orifice is in fluid communication with the injector cleaning device and is adapted to at least one of inject a liquid jet into in the area (e.g., a hot stream or plasma created in the area) of the thermal spray gun and receive feedstock, gas and liquid passing into said inlets.

In embodiments, the at least one feedstock supply line, the at least one gas supply line, and the at least one liquid medium supply line are located upstream of the injector orifice.

In embodiments, the apparatus further comprises a mounting arrangement adapted to couple the injector cleaning device to a portion of the plasma spray gun.

In embodiments, the injector cleaning device comprises a purge block section and a mist chamber section.

In embodiments, the injector cleaning device comprises a mist chamber section and the inlet connectable to at least one gas supply line and the inlet connectable to at least one liquid medium supply line are at least one of arranged on the mist chamber section and coupled to the mist chamber section.

In embodiments, the injector cleaning device comprises a purge block section and the inlet connectable to at least one feedstock supply line is at least one of arranged on the purge block section and coupled to the purge block section.

In embodiments, the apparatus further comprises a mounting arrangement adapted to couple the injector cleaning device to a discharge end of the plasma spray gun.

In embodiments, the mounting arrangement comprises a gun mount securable to the plasma spray gun.

In embodiments, the mounting arrangement comprises a gun mount removably securable to the plasma spray gun.

In embodiments, the mounting arrangement comprises at least one of a gun mount securable to the plasma spray gun, a mounting block, and a support plate adapted to connect the mounting block to the injector cleaning device.

In accordance with a non-limiting aspect of the invention there is provided an injector cleaning apparatus for a plasma spray gun. The apparatus comprises at least one feedstock supply line, at least one gas supply line, and at least one liquid medium supply line. The at least one feedstock supply line, the at least one gas supply line, and the at least one liquid medium supply line are located upstream of an injector orifice located in an area of the plasma spray gun.

In embodiments, at least one of the feedstock supply line, the gas supply line and the liquid medium supply line are removably connected to an injector assembly.

In embodiments, the at least one liquid medium supply line is connected to a liquid medium supply that contains a liquid medium.

In embodiments, the liquid medium is a rinsing agent.

In embodiments, the liquid medium is a liquid structured and arranged to clean an injector for injecting feedstock.

In embodiments, the feedstock supply line is connected to a hopper that contains a feedstock.

In embodiments, the feedstock is at least one of a suspension, a precursor and a solution.

In embodiments, the apparatus further comprises a mister that mists liquid medium prior to entry of the liquid medium into an injector for injecting feedstock.

In embodiments, the apparatus further comprises a purging arrangement having two switchable mode as follows; a first mode wherein liquid feed is fed to the injector orifice and a second mode wherein liquid medium is fed to the injector orifice.

In embodiments, the apparatus further comprises an injector cleaning device adapted to combine liquid medium and purge gas upstream of the injector orifice.

In embodiments, the apparatus further comprises a controller adapted to control flow of at least one of a feedstock, a gas, a liquid medium, and a purging fluid.

In embodiments, there is provided a system for injecting a liquid jet into plasma of a plasma spray gun, comprising a plasma spray gun and an injector cleaning apparatus of any of the types described above.

In embodiments, there is provided a method of injecting a liquid jet into plasma of a plasma spray gun comprising arranging the injector cleaning apparatus of any of the types described above on a plasma spray gun and discharging a liquid via the injector orifice.

In embodiments, there is provided a method of injecting a liquid jet into plasma of a plasma spray gun comprising arranging the injector cleaning apparatus of any of the types described above on a plasma spray gun and injecting, via the injector orifice, a liquid jet into a plasma created in the area of the plasma spray gun.

In accordance with another non-limiting aspect of the invention there is provided a method of using the apparatus or system of any one of the types described above. The method comprises at least one of; activating a flow of liquid cleaning fluid in a gas dispersant after a flow of liquid feedstock is stopped, automatically producing a flow of an atomized liquid cleaning fluid after shut down of a flow of liquid feedstock, and activating a flow of liquid cleaning fluid in a gas dispersant each time a flow of liquid feedstock is stopped or shut down. The activating or producing substantially prevents build-up of obstruction material or crust formation on at least one flow surface arranged upstream of the injector orifice.

In embodiments, preferably as little liquid as possible is used to purge or clean the system. Gas options include at least one of argon, nitrogen, helium, methane and other suitable gasses. Liquid medium options include water, alcohols, glycol, glycerin, organic liquids (for example kerosene) and other cleaning solvents. Examples of an amount of liquid medium per purge shot include: minimum about 0.001 cc to unlimited (resulting in an almost continuous or continuous flow), preferably about 0.01 to about 1 cc liquid. The minimum amount of liquid to be used is preferably to achieve at least the dew point of the gas that is used. Mist is preferred over liquid because liquid is too slow through orifice—the mist can be under greater pressure. Misting or other ways similar to misting may be used. Purge shots can range from about 1 to about 400 per minute, preferably about 20 to about 100 shots per minute. A gas atomizer can be used instead of misting and is another way of cleaning the injector. In a preferred embodiment, use of less liquid with higher frequency of shots is preferred.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted drawings by way of a non-limiting example embodiment of the present invention, and wherein:

FIG. 7 shows a perspective view of the injector cleaning device used in the apparatus of FIG. 5;

FIG. 8 shows a front view of the injector cleaning device of FIG. 7;

FIG. 9 shows a side cross-section view of section A-A in FIG. 8;

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

A liquid feeder proof of concept prototype was successfully developed and tested. It demonstrated that continuous and stable operation of a liquid based feedstock feeder is possible. A novel approach to semi-automated injector cleaning was developed and showed robustness on a level necessary for industrial thermal spray applications.

The prototype feeding system was used to produce coatings with ultrafine splats from liquid feedstock suspensions of Alumina, Titania and YSZ. Analysis of the resulting coating structure and composition showed favorable results with potential for further optimization for specific applications.

Figure 1:
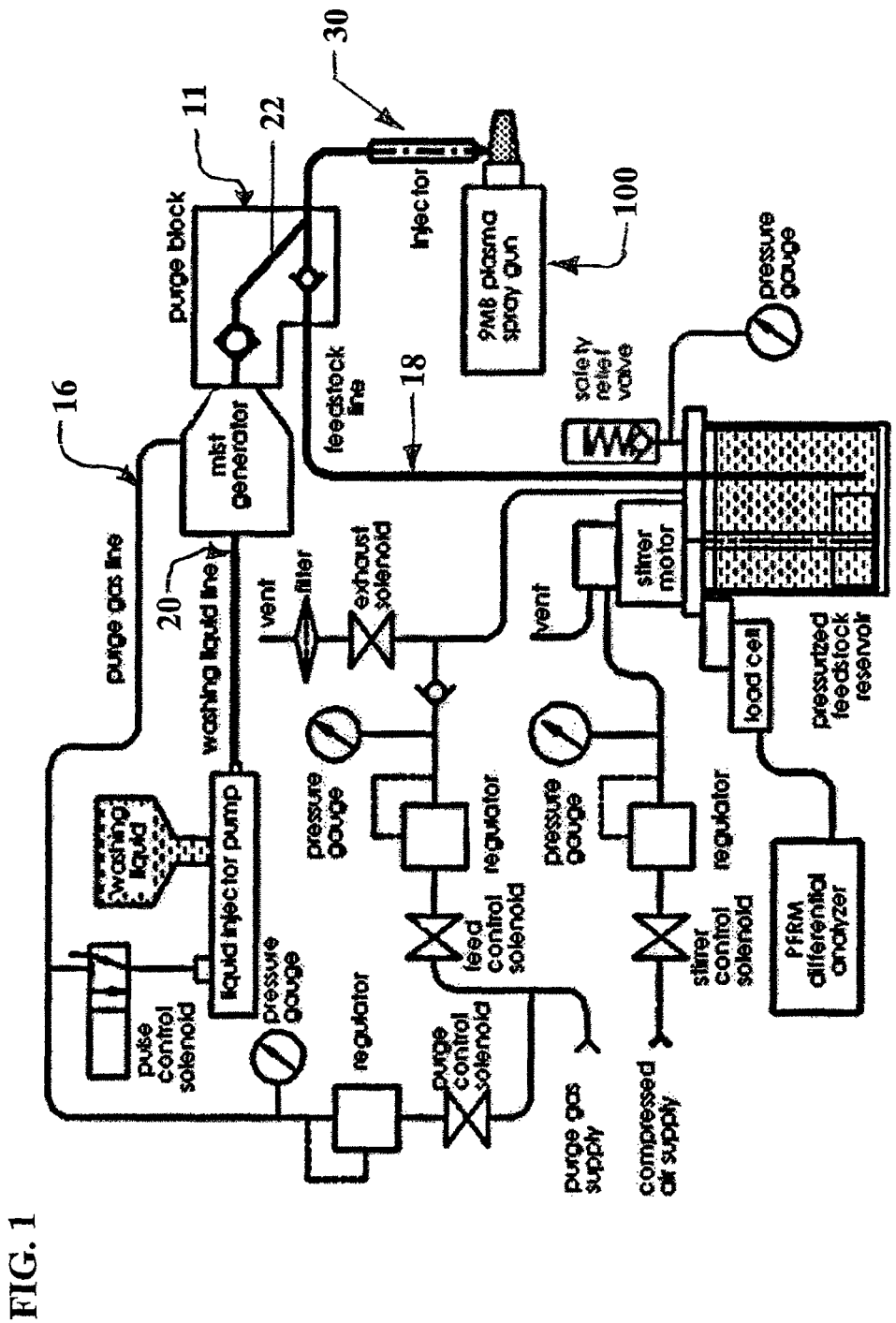
FIG. 1 shows a schematic of an experimental prototype pressurized liquid feed system in accordance with the invention.

FIG. 1 shows a principal schematic of the developed prototype system or arrangement in accordance with one non-limiting embodiment of the invention. In the system, a feedstock is contained in a pressurized feedstock reservoir that is mounted off a load cell connected to a Powder Feed Rate Meter (PFRM) differential analyzer. It displays an actual weight loss of the feedstock reservoir in either g/min or lb/hr as selected by operator.

A top cover of the reservoir has a built-in pneumatically driven stirrer motor that keeps the feedstock suspension mildly agitated to prevent sedimentation and to maintain the uniformity of solids concentration throughout. The stirrer operates by compressed air taken from a shop air supply line. It turns on or off via the stirrer control solenoid and allows for a speed adjustment. To facilitate this operation, the system utilizes a front panel pressure regulator. A pressure gauge reading serves as an indirect indicator of stirrer speed.

A single source of gas (argon or nitrogen) is used for both injector purge and feedstock feed functions. When the feed control solenoid is on, a pressure regulator adjusts the desired level of pressure applied to reservoir. The pressurized feedstock charges the feedstock line 18 and exits through injector 30 into the plasma plume. To stop feeding, a feed control solenoid turns off and a purge control solenoid and exhaust solenoid turns on allowing a purge gas line 16 to pressurize and the feedstock reservoir and feedstock line 18 to de-pressurize. A delay-on-break timer keeps purge and exhaust solenoids on to allow the reservoir to de-pressurize completely.

Simultaneously, a recycling timer turns on and off a pulse control solenoid that supplies pressure pulses to a liquid injector pump. The amount of liquid delivered with each stroke can be adjusted from about 0 to about 0.1 cc by the adjustment screw that limits travel of pump plunger. A washing liquid from the pump reservoir charges washing liquid line 20 and enters mist generator where it mixes with purge gas and washes internal passages of feedstock injector. A check valve on the feedstock line 18 prevents the purge mix from entering and diluting feedstock.

Figure 2:
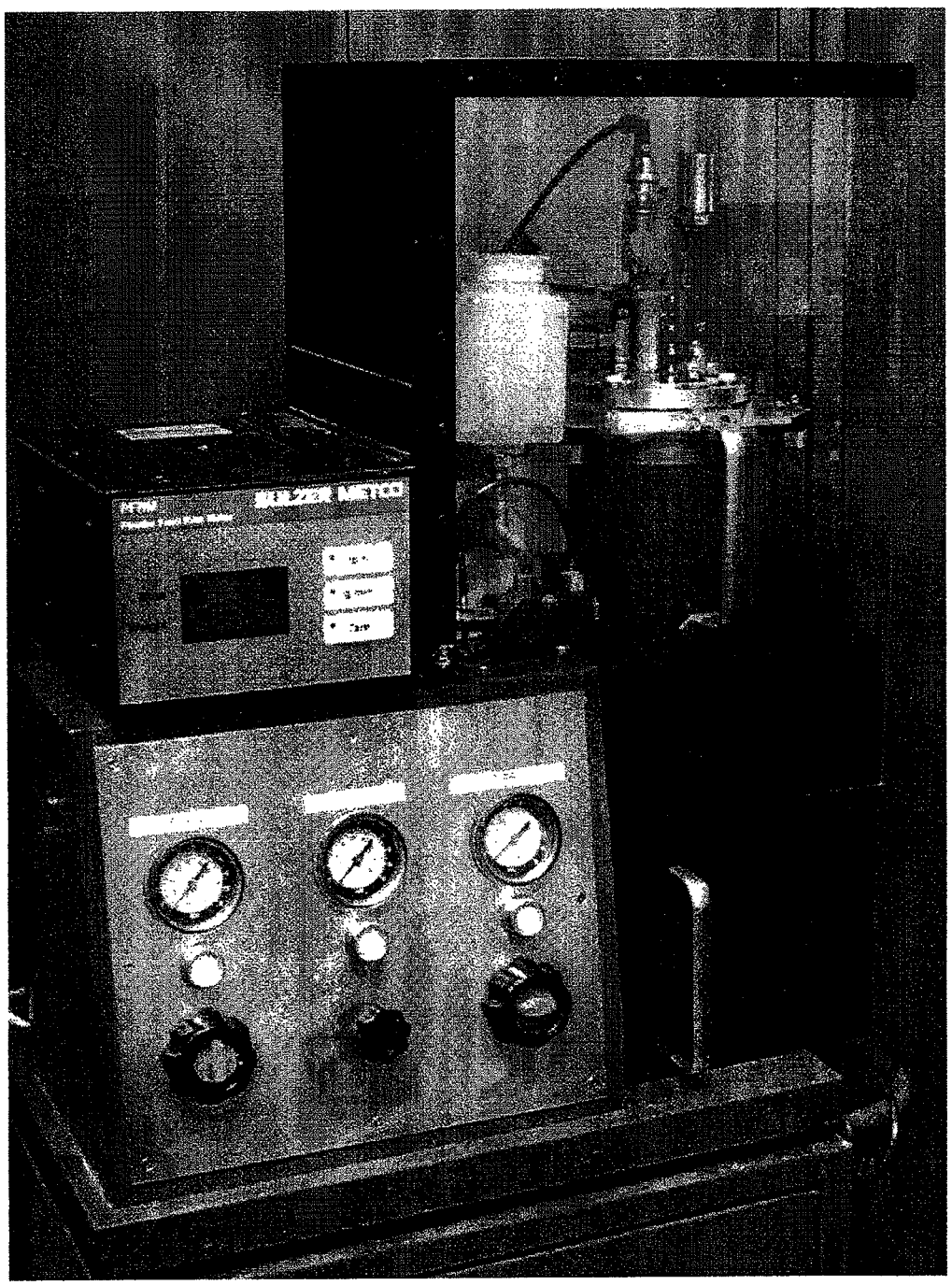
FIG. 2 shows a photograph of the experimental prototype schematically illustrated in FIG. 1.
Figure 3:
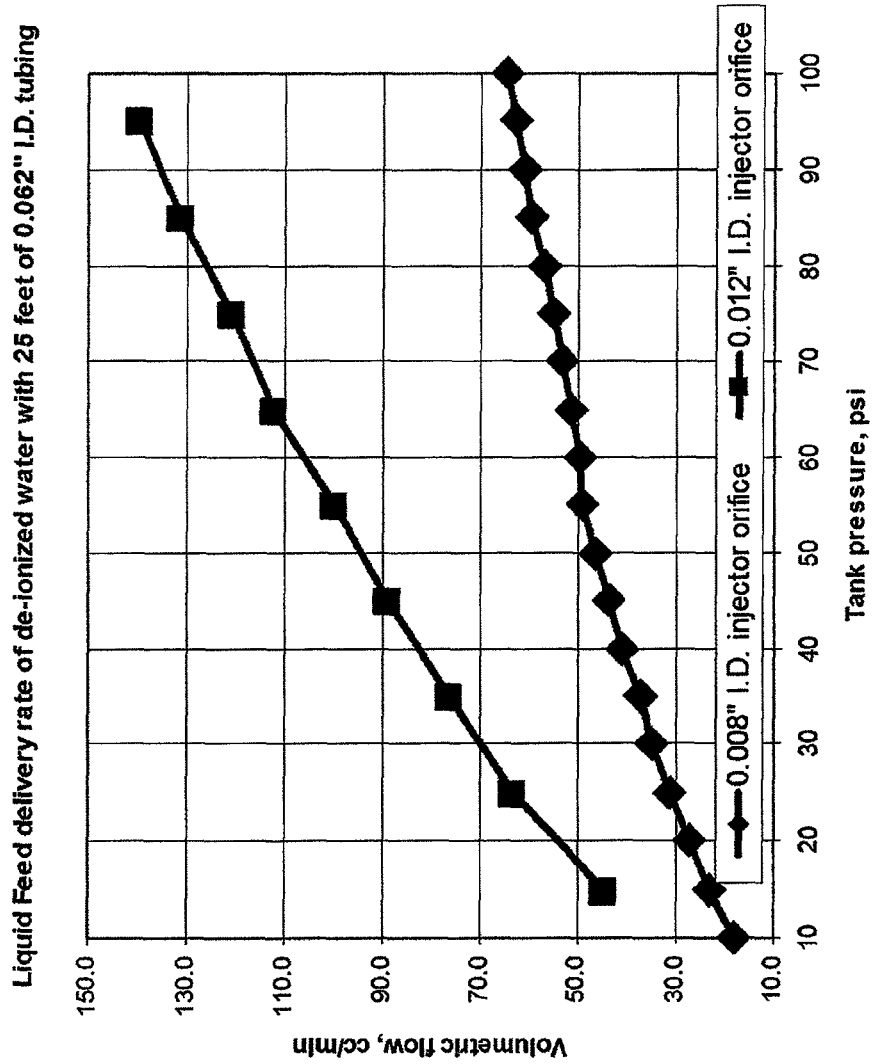
FIG. 3 shows a chart describing a liquid feed delivery rate for de-ionized water at room temperature. The upper curve relates to 0.012" I.D. injector orifice while the lower curve relates to 0.008" I.D. injector orifice.
Figure 4:
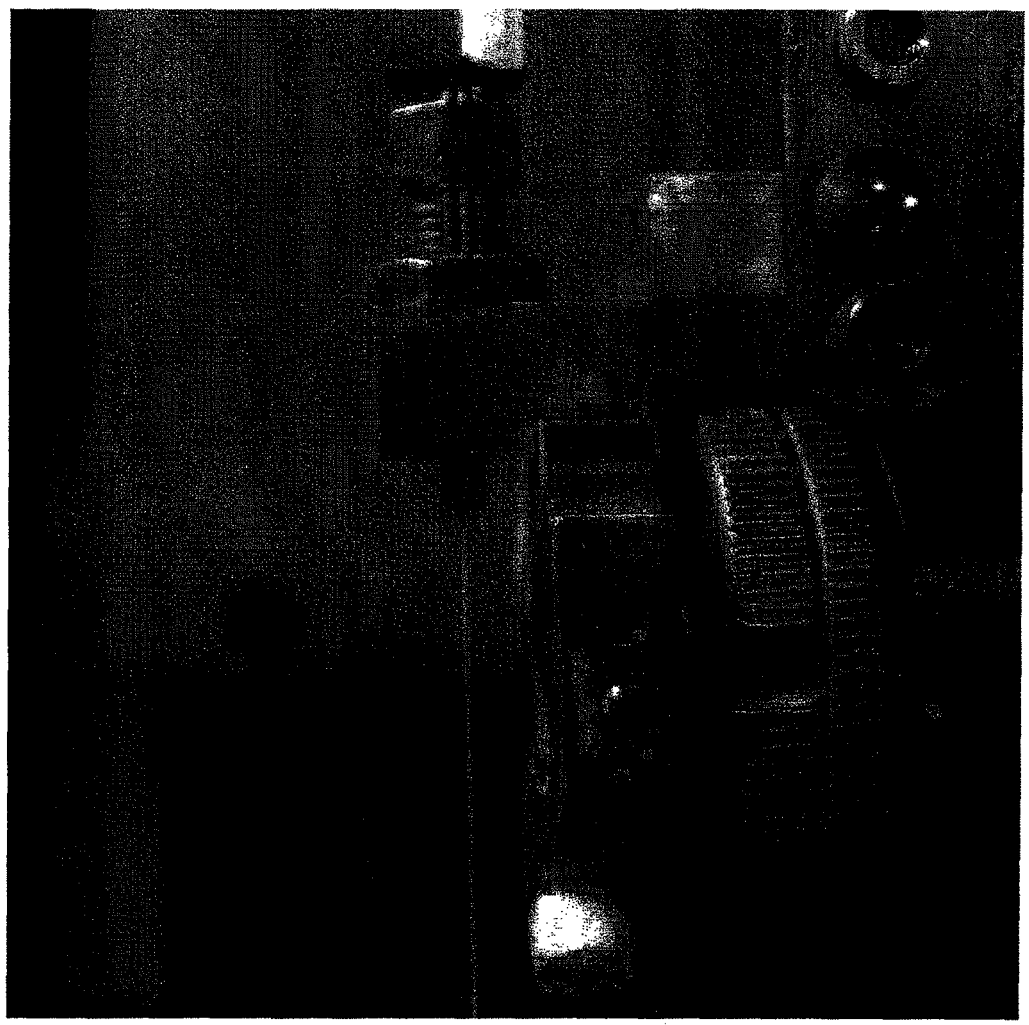
FIG. 4 shows a photograph of idle suspension jet mounted to a 9 MB plasma spray gun in accordance with the invention.

The complete system created and used is shown on FIG. 2. All tests have been performed with feedstock reservoir of 2 liter capacity and 25 feet (7.62 m) long feedstock line of 0.062" (1.6 mm) I.D. (inside diameter). The actual delivery rate depends greatly on feedstock viscosity and injector size and internal profile. FIG. 3 shows a baseline comparison between de-ionized water rates through injectors with orifice sizes of 0.008" (0.2 mm) and 0.012" (0.3 mm). A suspension jet from an injector 30 mounted off 9 MB plasma gun nozzle is shown in FIG. 4.

Performance Testing of the System

The experimental prototype of liquid feed system of FIGS. 1 and 2 has shown a fairly robust performance for all tested suspensions. A novel purge system kept the injector clean and even allowed the feedstock line to be kept fully charged and waiting for 1-1.5 hr without injector dismounting during short work breaks. For overnight breaks, the whole injector mount was taken off the gun and placed into a container filled with water. The next day it was ready to work right after mounting back onto the plasma gun nozzle. Longer periods of storage or changes between feedstock required full clean-up of the feedstock reservoir, lines and injector mount.

Injector Feedstock Cleaning Apparatus

Figure 5:
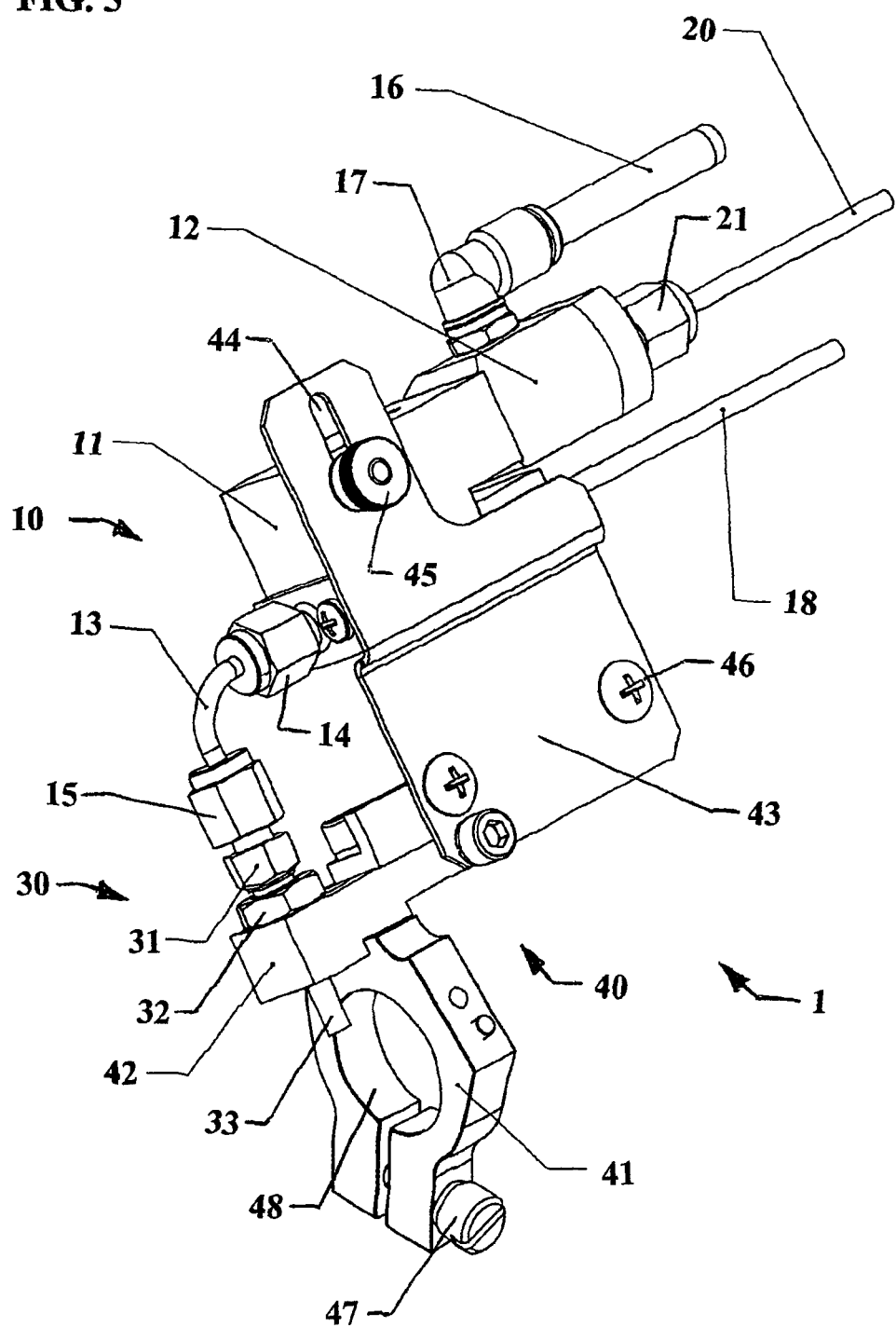
FIG. 5 shows a perspective view of an injector feedstock cleaning apparatus which can be used with the pressurized liquid feed system of FIG. 1 and in accordance with the invention.
Figure 6:
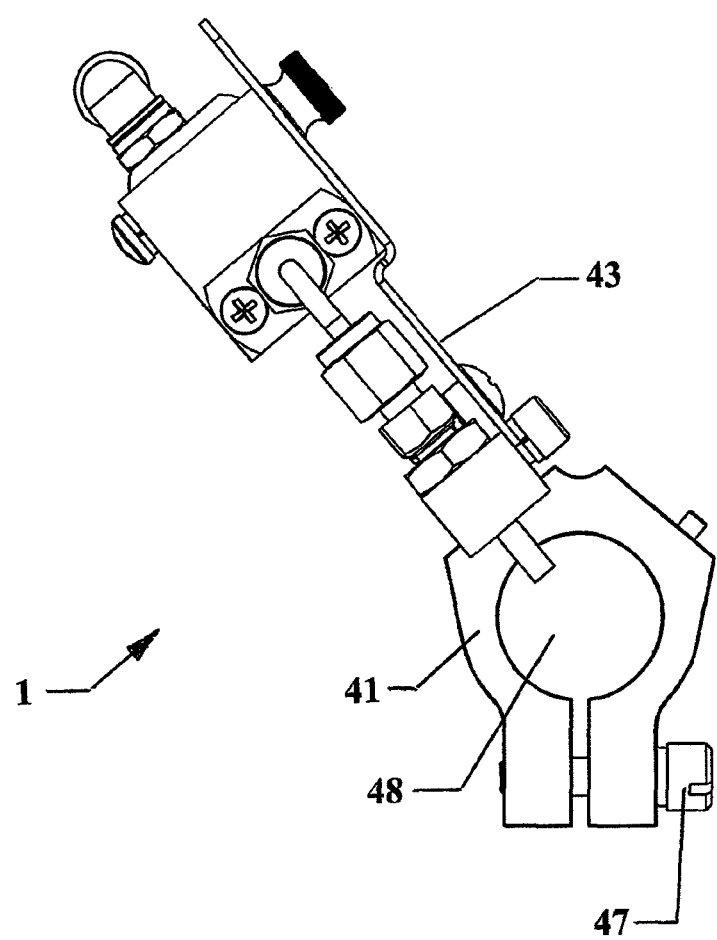
FIG. 6 shows a front view of FIG. 5.

A non-limiting injector feedstock cleaning apparatus which can be used with the non-limiting system of FIG. 1 is shown in FIGS. 5-9. The apparatus 1 is utilized for injecting a liquid in an area of a plasma spray gun 100 (see FIG. 1). As shown in FIG. 5, the apparatus 1 has three main components. A first component is an injector cleaning device 10 which includes an inlet (see FIG. 9) connectable to a connector 19 of at least one feedstock supply line 18, an inlet connectable to a connector 17 of at least one gas supply line 16, and an inlet connectable to a connector 21 of at least one liquid medium supply line 20. Also includes is a mist chamber section 12 to which lines 16 and 20 are connected and a purge block section 11 to which line 18 is connected. An internal passage 22 (see FIG. 9) forms a fluid connection path between an internal space coupled to lines 16 and 20 and to an output passage in the purge block section 11 leading to an injector 30. Lines 16 and 20 feed gas and liquid into an atomizing chamber 23. Once the liquid from the line 20 is dispersed in the gas from line 16, it can pass by a check valve 24 and then travel through passage 22. The check valve 24 is a one-way valve that prevents backflow and specifically prevents any feedstock from passing into the chamber 23 when the feedstock is being fed out of the injector 30. Line 18 feeds feedstock into a chamber containing another check valve 25 which then travels through passage containing a filter 26, e.g., a final screen filter which can trap particles or contamination that capable of clogging the injector 30. The check valve 25 is a one-way valve that prevents backflow and specifically prevents any fluid passing through passage 22 from passing into the feedstock line 18 when the dispersed cleaning fluid is being fed out of the injector 30.

The injector 30 forms a second main component of the apparatus 1. An elbow tubing connector 13 has connectors 14 and 15 which connect the output port of the purge block 11 to an input 31 of the injector 30. In this way, feedstock and/or fluid passing out of the purge block 11 can pass through an injector body 32 and out of an injector orifice 33.

A third component of the apparatus 1 is a mounting arrangement 40. The mounting arrangement 40 couples the injector cleaning device 10 and injector 30 to a portion or discharge end of the plasma spray gun 100 (see FIGS. 1 and 2). The mounting arrangement 40 includes a gun mount 41 whose opening 48 slides over a portion of the plasma spray gun 100 and which is securable or removably clampable to the plasma spray gun 100. A fastener 47 can be used to adjust the clamping force of and allow for removal of the gun mount 41. The gun mount 41 is coupled to a mounting block 42 to which the injector body 32 is also mounted in a manner which maintains a desired or predetermined distance between the injector output or orifice 33 and the block 41. A support plate 43 connects the mounting block 42 to the injector cleaning device 10 and, more specifically, to the purge block 11 of the device 10. Fasteners 46 connect the plate 43 to the mounting block 42. An adjusting device in the form of a fastener nut 45 adjustably connects the plate 43 to the purge block 11 while a slot 44 provides for sliding adjustability.

Figure 10:
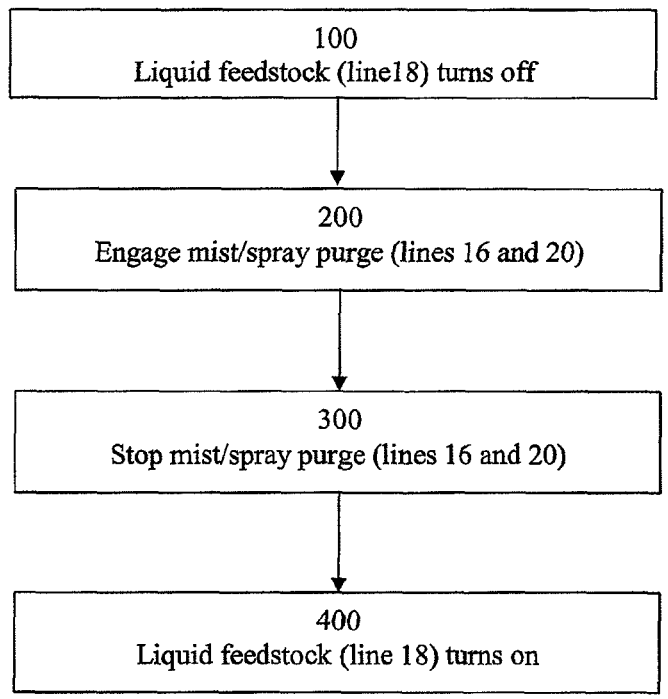
FIG. 10 shows a non-limiting method of using the apparatus of the invention in accordance with one exemplary mode of operation.

The modes of operation of the apparatus 1 will now be discussed with reference to FIGS. 1 and 5-9 and as exemplified in the non-limiting modes shown in FIGS. 10 and 11. In FIG. 10, the apparatus can be utilized in accordance with a method of cleaning and cooling the injector during intermittent shutdown of liquid feedstock while the gun is running, i.e., liquid feedstock passing through the injector 30 and arriving via conduit 18 is stopped and restarted without stopping a thermal spray gun. Additionally or alternatively, in cases where thermal spray gun has to be stopped and to prevent overheating of the injector, the mode described in FIG. 11 can be utilized. One should keep in mind, however, the problem of engaging liquid feedstock flow while the injector is hot because it can cause precipitation and clogging of the same.

More specifically, in the mode of FIG. 10, liquid feedstock passing out of injector 30 and through the cleaning device 10 after arriving via line 18 is stopped at stage 100. Then, gas and cleaning liquid pass through the device 10 and out of the injector 30 after arriving via lines 16 and 20 in stage 200. This can occur for a predetermined amount of time via a timer or by input from an operator. The device 10 ensures that the gas and liquid produce therein a purging mist which passes into and out of the injector 30 and keeps it clean and cool. After, the purging mist is stopped in stage 300 and the device 10 resumes the feeding of liquid feedstock into and out of injector 30 in stage 400.

Figure 11:
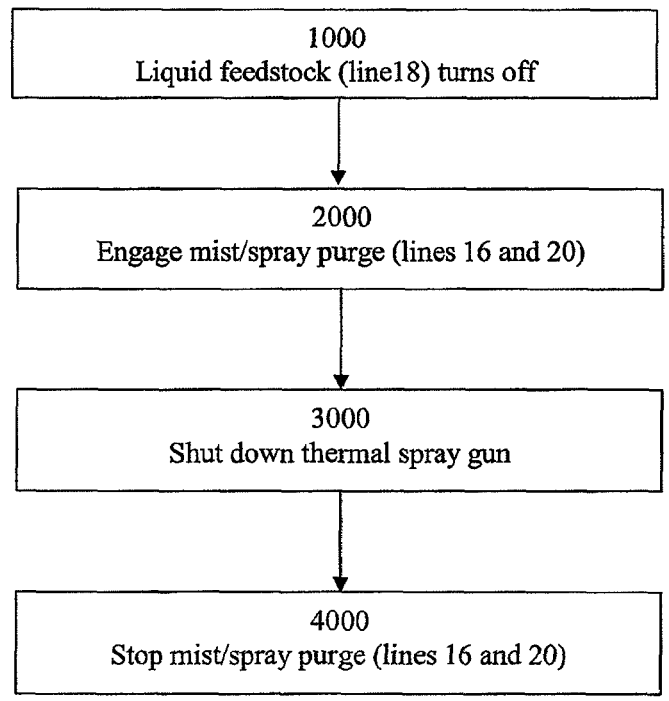
FIG. 11 shows a non-limiting method of using the apparatus of the invention in accordance with another exemplary mode of operation.

In the mode of FIG. 11, liquid feedstock passing out of injector 30 and through the cleaning device 10 after arriving via line 18 is similarly stopped at stage 1000. Then, gas and cleaning liquid pass through the device 10 and out of the injector 30 after arriving via lines 16 and 20 in stage 2000. The thermal spray gun 100 can then be shut down in stage 3000. After shut down, the purging mist is stopped in stage 4000. This can occur after a predetermined amount of time via the timer. The device 10 can then resume the feeding of liquid feedstock into and out of the injector 30 at a later time or date.

In one exemplary embodiment, the flow rate of fluid passing out of the orifice of the injector 30 is approximately 16 scfh (standard cubic feet per hour) utilizing a 0.012 inch orifice at 120 psi. In another exemplary embodiment, the flow rate of fluid passing out of the orifice of the injector 30 is approximately 7.2 scfh utilizing a 0.008 inch orifice at 120 psi. In still another exemplary embodiment, the flow rate of fluid passing out of the orifice of the injector 30 is approximately 1.8 scfh utilizing a 0.004 inch orifice at 120 psi. In embodiments, any liquid pump can be utilized to feed washing fluid to the mist nozzle provided it functions in the coating environment.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and sprit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. An apparatus for injecting a liquid in an area of a thermal spray gun, the apparatus comprising:
    an injector cleaning device comprising:
        an inlet connectable to at least one feedstock supply line;
        an inlet connectable to at least one gas supply line;
        an inlet connectable to at least one liquid medium supply line; and
        an atomizing chamber receiving gas via the at least one gas supply line and cleaning liquid via the at least one liquid medium supply line and producing a purging mist that can be fed to feedstock supply passage;
    an injector orifice in fluid communication with the atomizing chamber of the injector cleaning device and being adapted to at least one of:
        inject a liquid jet into the area of the thermal spray gun; and
        receive feedstock, gas and liquid passing into said inlets.

2. The apparatus of claim 1, wherein the atomizing chamber is coupled via a passage to the feedstock supply passage arranged upstream of the injector orifice.

3. The apparatus of claim 1, wherein the at least one feedstock supply line, the at least one gas supply line, and the at least one liquid medium supply line are located upstream of the injector orifice.

4. The apparatus of claim 1, further comprising a mounting arrangement adapted to couple the injector cleaning device to a portion of the thermal spray gun.

5. The apparatus of claim 1, wherein the injector cleaning device comprises at least one of:
    a purge block section and a mist chamber section;
    a mist chamber section comprising the atomizing chamber arranged upstream of a check valve;
    a purge block section comprising a check valve and a filter for preventing contaminates entrained in liquid or gas from passing out of the injector orifice; and
    a purge block section comprising a passage in fluid communication with a check valve arranged downstream of the inlets of the liquid medium and gas supply lines and in fluid communication with another passage arranged downstream of the feedstock supply line.

6. The apparatus of claim 1, wherein the injector cleaning device comprises a mist chamber section and the inlet connectable to at least one gas supply line and the inlet connectable to at least one liquid medium supply line are at least one of:
    arranged on the mist chamber section; and
    coupled to the mist chamber section.

7. The apparatus of claim 1, wherein the injector cleaning device comprises a purge block section and the inlet connectable to at least one feedstock supply line is at least one of:
    arranged on the purge block section; and
    coupled to the purge block section.

8. The apparatus of claim 1, further comprising a mounting arrangement adapted to couple the injector cleaning device to a discharge end of the thermal spray gun.

9. The apparatus of claim 8, the mounting arrangement comprising a gun mount securable to the thermal spray gun.

10. The apparatus of claim 8, the mounting arrangement comprising a gun mount removably securable to the thermal spray gun.

11. The apparatus of claim 8, the mounting arrangement comprising at least one of:
    a gun mount securable to the thermal spray gun;
    a mounting block; and
    a support plate adapted to connect the mounting block to the injector cleaning device.

12. A system for injecting a liquid jet into hot stream or plasma of a thermal spray gun, comprising:
    a thermal spray gun; and
    the injector cleaning apparatus of claim 1.

13. A method of injecting a liquid jet into hot stream or plasma of a thermal spray gun, comprising:
    arranging the injector cleaning apparatus of claim 1 on a thermal spray gun; and
    injecting, via the injector orifice, a liquid jet into a hot stream or plasma created in the area of the thermal spray gun.

14. A method of using the apparatus of claim 1, comprising at least one of:
    producing a flow of an atomized liquid cleaning fluid after shut down of a flow of liquid feedstock; and
    whereby the producing substantially prevents build-up of obstruction material or crust formation on at least one flow surface arranged upstream of the injector orifice.

15. An injector cleaning apparatus for a thermal spray gun, comprising:
    at least one feedstock supply line coupled to a feed stock supply passage;
    an injector orifice arranged downstream and being in fluid communication with the feedstock supply passage;
    at least one gas supply line;
    at least one liquid medium supply line configured to supply cleaning liquid medium;
    a mist chamber receiving gas and cleaning liquid respectively via said gas supply line and said liquid medium supply line;
    the mist chamber being configured to supply a purging mist to the feedstock supply passage at a location between said feedstock supply line and the injector orifice,
    wherein the at least one feedstock supply line, the at least one gas supply line, and the at least one liquid medium supply line are located upstream of the injector orifice located in an area of the thermal spray gun.

16. The apparatus of claim 15, wherein at least one of the feedstock supply line, the gas supply line and the liquid medium supply line are removably connected to an injector assembly.

17. The apparatus of claim 15, wherein the at least one liquid medium supply line is connected to a liquid medium supply that contains the cleaning liquid medium.

18. The apparatus of claim 17, wherein the cleaning liquid medium is a rinsing agent.

19. The apparatus of claim 17, wherein the cleaning liquid medium is a liquid structured and arranged to clean an injector for injecting feedstock.

20. The apparatus of claim 15, wherein the feedstock supply line is connected to a hopper that contains a feedstock.

21. The apparatus of claim 20, wherein the feedstock is at least one of a suspension, a precursor and a solution.

22. The apparatus of claim 15, further comprising a purging arrangement having two switchable mode as follows:
   a first mode wherein liquid feed is fed to the injector orifice; and
   a second mode wherein liquid medium is fed to the injector orifice.

23. The apparatus of claim 15, further comprising a controller adapted to control flow of at least one of:
   a feedstock;
   a gas;
   a liquid medium; and
   a purging fluid.

24. A system for injecting a liquid jet into a hot stream or plasma of a thermal spray gun, comprising:
   a thermal spray gun; and
   the injector cleaning apparatus of claim 15.

25. A method of injecting a liquid jet into hot stream or plasma of a thermal spray gun, comprising:
   arranging the injector cleaning apparatus of claim 15 on a thermal spray gun; and
   at least one of:
      discharging a liquid via the injector orifice;
      discharging each of a feedstock and a cleaning liquid via the injector orifice at two different points in time; and
      discharging a feedstock via the injector orifice during a feedstock feed cycle and discharging a cleaning fluid via the injector orifice during a cleaning fluid cleaning cycle.

26. An apparatus for injecting a liquid in an area of a thermal spray gun, the apparatus comprising:
   an injector orifice configured to discharge each of:
      a feedstock material received a feedstock supply line; and
      a purging mist;
   an injector cleaning device comprising:
      an inlet connectable to at least one gas supply line;
      an inlet connectable to at least one cleaning liquid supply line;
      an atomizing chamber receiving gas via the at least one gas supply line and cleaning liquid via the at least one cleaning liquid supply line to produce the purging mist; and
   a check valve arranged in a feedstock supply passage between a feedstock supply inlet and the injector orifice,
   wherein the purging mist is fed to the feedstock supply passage at a location downstream of the check valve and upstream of the injector orifice.

27. The apparatus of claim 26, wherein the atomizing chamber is coupled via a passage to the feedstock supply passage and further comprising another check valve arranged between the passage and the atomizing chamber.

* * * * *